(12) United States Patent
Kurachi

(10) Patent No.: US 11,664,795 B2
(45) Date of Patent: May 30, 2023

(54) SWITCH CIRCUIT

(71) Applicants: Kabushiki Kaisha Toshiba, Tokyo (JP); Toshiba Electronic Devices & Storage Corporation, Tokyo (JP)

(72) Inventor: Satoshi Kurachi, Yokohama Kanagawa (JP)

(73) Assignees: KABUSHIKI KAISHA TOSHIBA, Tokyo (JP); TOSHIBA ELECTRONIC DEVICES & STORAGE CORPORATION, Tokyo (JP)

(*) Notice: Subject to any disclaimer, the term of this patent is extended or adjusted under 35 U.S.C. 154(b) by 0 days.

(21) Appl. No.: 17/670,099

(22) Filed: Feb. 11, 2022

(65) Prior Publication Data

US 2023/0097937 A1   Mar. 30, 2023

(30) Foreign Application Priority Data

Sep. 24, 2021  (JP) .............................. JP2021-155258

(51) Int. Cl.
*H03K 17/041* (2006.01)
*H03K 17/10* (2006.01)
*H03K 17/687* (2006.01)

(52) U.S. Cl.
CPC ..... *H03K 17/04106* (2013.01); *H03K 17/102* (2013.01); *H03K 17/6871* (2013.01)

(58) Field of Classification Search
CPC .......... H03K 17/04106; H03K 17/102; H03K 17/6871
See application file for complete search history.

(56) References Cited

U.S. PATENT DOCUMENTS

| | | | |
|---|---|---|---|
| 6,218,890 B1 | 4/2001 | Yamaguchi et al. | |
| 8,923,781 B2 | 12/2014 | Kunishi et al. | |
| 10,153,803 B2 | 12/2018 | Sugawara et al. | |
| 2013/0009725 A1* | 1/2013 | Heaney ................ | H03K 17/687 257/E21.317 |
| 2019/0036307 A1* | 1/2019 | Yan ...................... | H04B 10/541 |

FOREIGN PATENT DOCUMENTS

| | | |
|---|---|---|
| JP | 3426993 B2 | 7/2003 |
| JP | 5383609 B2 | 1/2014 |
| JP | 6721472 B2 | 7/2020 |

* cited by examiner

*Primary Examiner* — Metasebia T Retebo
(74) *Attorney, Agent, or Firm* — Allen & Overy LLP

(57) ABSTRACT

A switch circuit of an embodiment includes a radio-frequency switch and a level shifter circuit. The radio-frequency switch, which includes a first switch group and a second switch group each including a plurality of switches, switches transmission/reception of a radio-frequency signal. The level shifter circuit outputs a first signal for controlling ON/OFF of each switch of the first switch group and a second signal for controlling ON/OFF of each switch of the second switch group.

4 Claims, 7 Drawing Sheets

SWITCH CIRCUIT

CROSS-REFERENCE TO RELATED APPLICATION

This application is based upon and claims the benefit of priority from the prior Japanese Patent Application No. 2021-155258 filed on Sep. 24, 2021; the entire contents of which are incorporated herein by reference.

FIELD

An embodiment described herein relates generally to a switch circuit.

BACKGROUND

A radio-frequency switch (hereinafter, referred to as an RF switch) is used to switch ON/OFF (switch transmission/reception) when radio signals are transmitted/received at a mobile phone base station, or the like, switch impedance tuning and perform switching to change a frequency band.

DETAILED DESCRIPTION

A switch circuit of an embodiment includes a radio-frequency switch and a level shifter circuit. The radio-frequency switch, which includes a first switch group and a second switch group each including a plurality of switches, switches transmission/reception of a radio-frequency signal. The level shifter circuit outputs a first signal for controlling ON/OFF of each switch of the first switch group and a second signal for controlling ON/OFF of each switch of the second switch group.

An embodiment will be described below with reference to the drawings.

Figure 1:
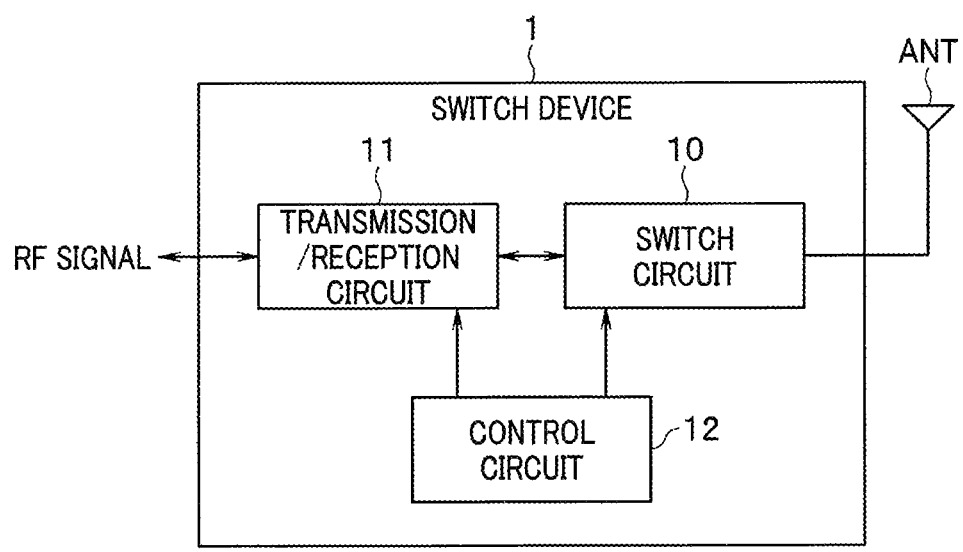
FIG. 1 is a configuration diagram illustrating an example of a configuration of a switch device including a switch circuit according to one embodiment.

FIG. 1 is a configuration diagram illustrating an example of a configuration of a switch device including a switch circuit according to one embodiment.

The switch device 1 is configured by including a switch circuit 10, a transmission/reception circuit 11 and a control circuit 12. Further, an antenna ANT is connected to the switch device 1. The control circuit 12 is connected to the switch circuit 10 and the transmission/reception circuit 11. Transmission/reception of a radio-frequency signal (hereinafter, referred to as an RF signal) is controlled by the control circuit 12 controlling the switch circuit 10 and the transmission/reception circuit 11. This configuration enables the switch device 1 to perform transmission and reception of an RF signal, or the like.

The control circuit 12 outputs a control signal CTRL which will be described later to the switch circuit 10. The switch circuit 10 is switched in accordance with the control signal CTRL from the control circuit 12.

Figure 2:
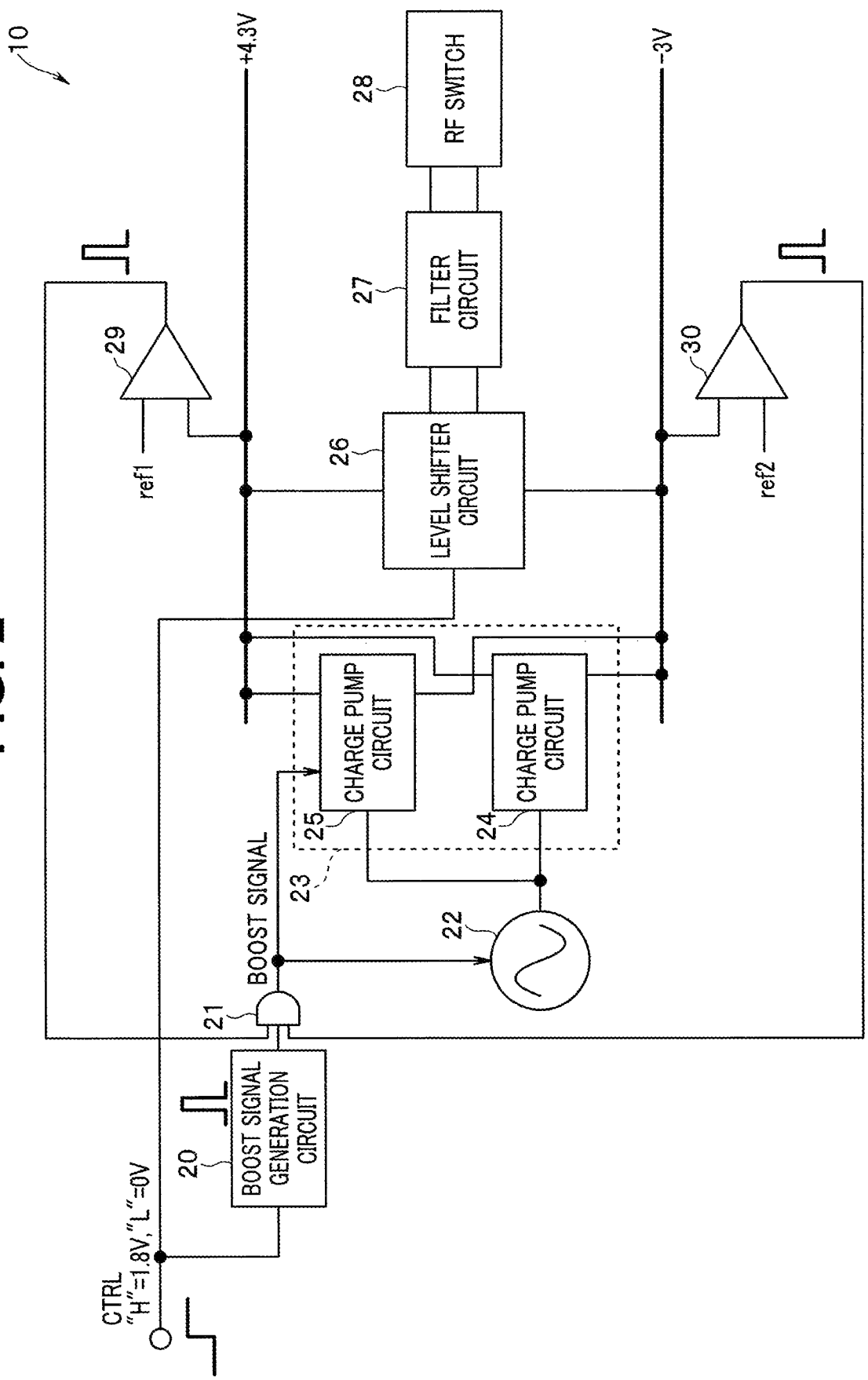
FIG. 2 is a configuration diagram illustrating an example of a configuration of the switch circuit.

FIG. 2 is a configuration diagram illustrating an example of a configuration of the switch circuit.

The switch circuit 10 is configured by including a boost signal generation circuit 20, an OR circuit 21, an oscillator (hereinafter, referred to as an OSC) 22, a charge pump portion 23 including charge pump circuits 24 and 25, a level shifter circuit 26, a filter circuit 27, an RF switch 28 and comparators 29 and 30.

The control signal CTRL from the control circuit 12 is input to the boost signal generation circuit 20. The control signal CTRL is a signal having an L level of 0 V and an H level of 1.8 V. In a case where the boost signal generation circuit 20 detects one of a rising edge at which a level of the control signal CTRL transitions from an L level to an H level and a falling edge at which a level of the control signal CTRL transitions from an H level to an L level, the boost signal generation circuit 20 outputs a boost signal (first boost signal) of an H level to the OR circuit 21.

To the OR circuit 21, in addition to the boost signal from the boost signal generation circuit 20, boost signals (second and third boost signals) of an H level are input from the comparators 29 and 30 as will be described later. In a case where a level of one of the boost signals from the boost signal generation circuit 20 and the comparators 29 and 30 is an H level, the OR circuit 21 outputs the boost signal of an H level to the OSC 22 and the charge pump circuit 25.

The OSC 22 can generate a clock signal (pulse signal) CLK of a predetermined frequency. The OSC 22 outputs the generated clock signal CLK of the predetermined frequency to the charge pump circuits 24 and 25. If the boost signal which will be described later is input, the OSC 22 generates a clock signal CLK for which a frequency is temporarily increased compared to the predetermined frequency and outputs the clock signal CLK to the charge pump circuits 24 and 25.

For example, a power supply VDD of 3 V or a ground GND of 0 V is input to the charge pump circuit 24 which configures a first charge pump circuit. The charge pump circuit 24 boosts or steps down the power supply VDD or the ground GND in accordance with the clock signal CLK and outputs +4.3 V (first voltage) or −3 V (second voltage). An output of +4.3 V is input to the level shifter circuit 26 and the comparator 29. An output of −3 V is input to the level shifter circuit 26 and the comparator 30.

The charge pump circuit 25 which configures a second charge pump circuit operates only when a boost signal is input. In other words, the charge pump circuit 25 increases current supply capability to increase drive capability in a case where the charge pump circuit 24 cannot output either +4.3 V or −3 V due to decrease in drive capability of the charge pump circuit 24.

A control signal CTRL having an L level of 0 V and an H level of 1.8 V is input to the level shifter circuit 26 from the control circuit 12. If 1.8 V is input as the control signal CTRL, the level shifter circuit 26 shifts a level of the signal to +4.3 V and outputs the signal to the filter circuit 27, and if 0 V is input as the control signal CTRL, the level shifter circuit 26 shifts a level of the signal to −3 V and outputs the signal to the filter circuit 27. While details will be described later, the level shifter circuit 26 outputs two signals OUT1 and OUT2 for which the level is shifted to +4.3 V or −3 V to the filter circuit 27.

The filter circuit 27 isolates (separates) noise, or the like, from the input signals OUT1 and OUT2 and outputs two signals from which noise, or the like, are isolated to the RF switch 28.

The RF switch 28 switches the switch on the basis of the input two signals. One end of the RF switch 28 is connected to the antenna ANT, and the other end is connected to the transmission/reception circuit 11. Such a configuration enables the switch circuit 10 to output the RF signal received via the antenna ANT to the transmission/reception circuit 11 or transmit the RF signal input from the transmission/reception circuit 11 via the antenna ANT.

The comparator 29 compares an output voltage of +4.3 V of the charge pump circuit 24 with a reference voltage ref1, and if the output voltage becomes lower than the reference voltage ref1, outputs a boost signal (signal of an H level) to the OR circuit 21.

The comparator 30 compares an output voltage of −3 V of the charge pump circuit 24 with a reference voltage ref2, and if the output voltage becomes higher than the reference voltage ref2, outputs a boost signal (signal of an H level) to the OR circuit 21.

The switch circuit 10 may be formed on an SOI (silicon on insulator). Forming the switch circuit 10 on the SOI can achieve a higher withstand voltage. Further, forming the switch circuit 10 on the SOI reduces parasitic capacitance compared to a bulk CMOS or can achieve higher-speed switching of the RF switch compared to a silicon substrate.

Figure 3:
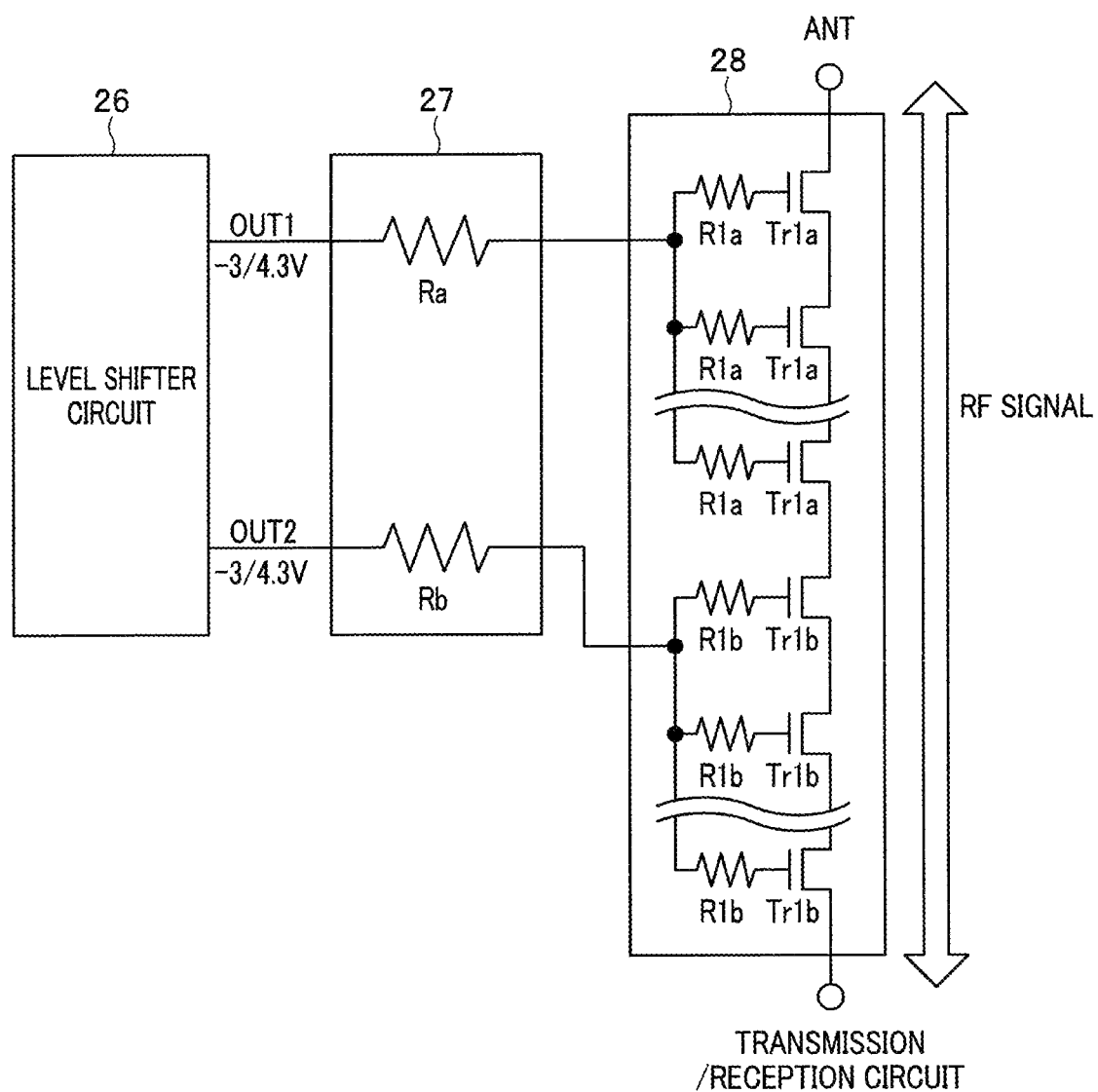
FIG. 3 is a configuration diagram illustrating an example of configurations of a filter circuit and an RF switch of the switch circuit.

FIG. 3 is a configuration diagram illustrating an example of configurations of the filter circuit and the RF switch of the switch circuit.

The filter circuit 27 includes resistors Ra and Rb for isolation. The resistors Ra and Rb for isolation are configured so as to prevent noise, or the like, from being input to the RF switch 28 from the filter circuit 27 side. The resistor Ra performs isolation on the signal OUT1 output from the level shifter circuit 26, and the resistor Rb performs isolation on the signal OUT2 output from the level shifter circuit 26.

The RF switch 28 includes a plurality of transistors Tr1$a$ and Tr1$b$ having sources and drains connected in series. One ends of resistors R1$a$ for withstand voltage for preventing the RF signal from leaking on the filter circuit 27 side are connected to gates of the respective transistors Tr1$a$. The other ends of a plurality of the resistors R1$a$ are connected to the resistor Ra for isolation.

Further, one ends of resistors R1$b$ for withstand voltage for preventing the RF signal from leaking on the filter circuit 27 side are connected to gates of the respective transistors Tr1$b$. The other ends of a plurality of the resistors R1$b$ are connected to the resistor Rb for isolation.

According to such a configuration, ON/OFF of the plurality of transistors Tr1$a$ which configure the first switch group is controlled with the signal OUT1 output from the level shifter circuit 26, and ON/OFF of the plurality of transistors Tr1$b$ which configure the second switch group is controlled with the signal OUT2 output from the level shifter circuit 26.

The transistors Tr1$a$ and Tr1$b$ which are switches configured in multiple stages are divided into two groups, and ON/OFF is controlled with different signals OUT1 and OUT2 from the level shifter circuit 26. As a result, the number of stages of switches which operate with the signal OUT1 and the number of stages of switches which operate with the signal OUT2 can be made smaller than the number of stages of all the switches, so that it is possible to shorten a switching period at the RF switch 28 as a whole.

The RF signal is input from the antenna ANT or output to the antenna ANT. As described above, one end of the RF switch 28 is connected to the antenna ANT, and the other end is connected to the transmission/reception circuit 11. In a case where the switch circuit 10 is used to perform switching upon impedance tuning, an element for tuning such as a capacitor and an inductor is connected to the other end of the RF switch 28.

Figure 4:
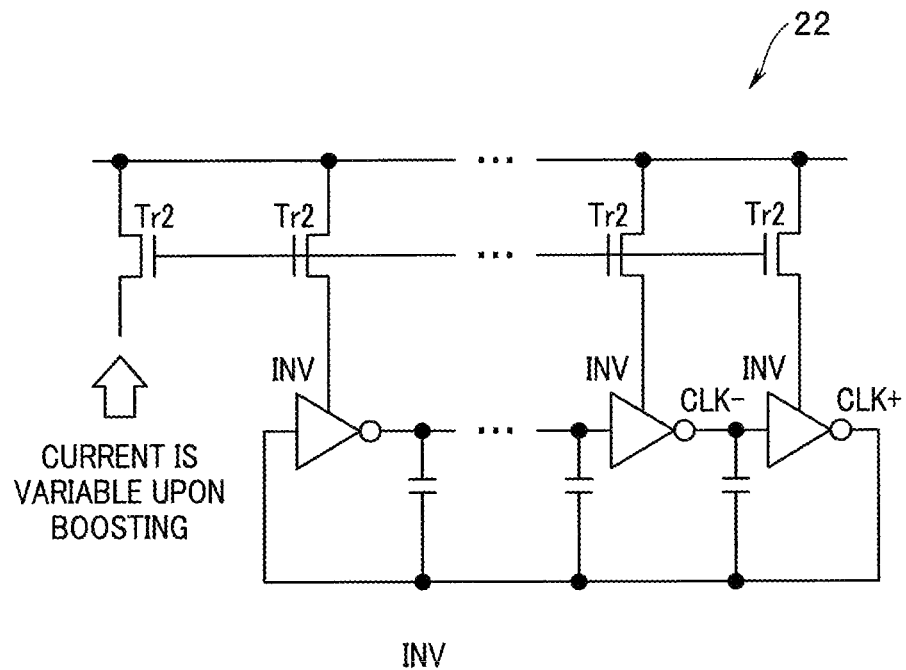
FIG. 4 is a circuit diagram illustrating an example of a circuit configuration of an OSC.

FIG. 4 is a circuit diagram illustrating an example of a circuit configuration of the OSC.

The OSC 22 is configured by connecting a plurality of inverters INV, which can make a delay amount variable, in a ring shape. The OSC 22 is configured to, if a boost signal is input, to increase currents to be supplied to the respective inverters INV via a plurality of transistors Tr2 and increase a frequency of the clock signal CLK.

Note that the OSC 22 is not limited to a ring oscillator in which a plurality of inverters INV are connected in a ring shape and may be other types of oscillators as long as the OSC 22 has a configuration that can generate a clock signal CLK of a predetermined frequency.

Figure 5:
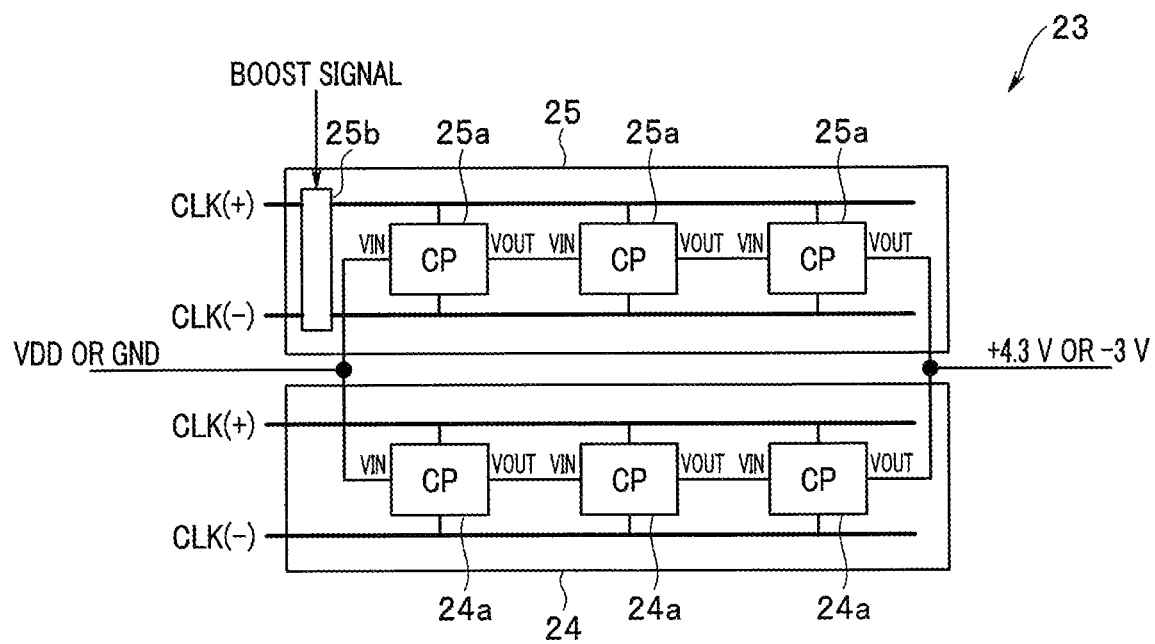
FIG. 5 is a configuration diagram illustrating an example of a configuration of a charge pump portion.
Figure 6:
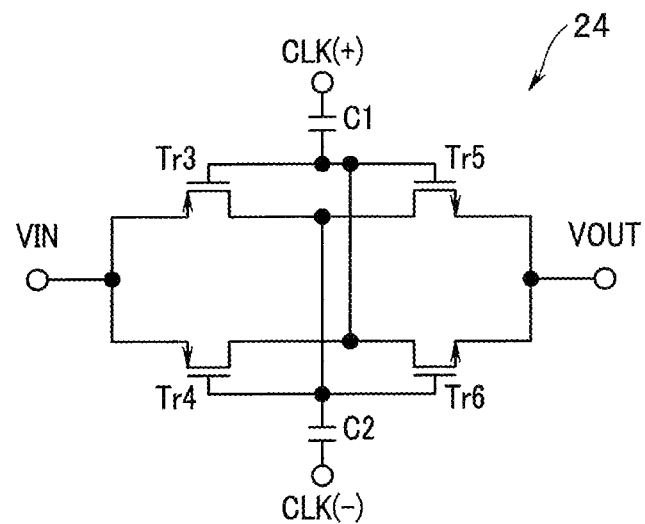
FIG. 6 is a circuit diagram illustrating an example of a circuit configuration of a charge pump circuit.

FIG. 5 is a configuration diagram illustrating an example of a configuration of the charge pump portion. FIG. 6 is a circuit diagram illustrating an example of a circuit configuration of the charge pump circuit.

The charge pump circuit 24 boosts or steps down the power supply VDD or the ground GND to output +4.3 V or −3 V. The charge pump circuit 24 may have a configuration in which a plurality of charge pump circuits 24$a$ are connected in series in a case where the power supply VDD or the ground GND cannot be boosted or stepped down to +4.3 V or −3 V by one charge pump circuit 24. The charge pump circuit 25 may also have a configuration in which a plurality of charge pump circuits 25$a$ are connected in series.

The clock signal CLK(+) from the OSC 22 and an inverted clock signal CLK(−) which is inverted by, for example, an inverter circuit are input to the charge pump circuits 24 and 25. A switch circuit 25$b$ is provided on signal lines of the clock signal CLK(+) and the inverted clock signal CLK(−) at the charge pump circuit 25.

The switch circuit 25$b$ performs switching so that the clock signal CLK and the inverted clock signal CLK(−) are input to the charge pump circuit 25 (or 25$a$) in a case where a boost signal of an H level is input. As a result, the charge pump circuit 25 (or 25$a$) operates only in a case where the boost signal is input, so that drive capability of the charge pump circuit 24 is enhanced.

As illustrated in FIG. 6, the charge pump circuit 24 is configured by including p-type transistors Tr3 and Tr4, n-type transistors Tr5 and Tr6, and capacitors C1 and C2. By controlling ON/OFF of the transistors Tr3 to Tr6 with the clock signal CLK(+) and the inverted clock signal CLK(−) and storing electric charges to the capacitors C1 and C2 or discharging electric charges from the capacitors C1 and C2, the charge pump circuit 24 outputs an output signal obtained by boosting or stepping down the input signal.

A configuration of the charge pump circuit 25 is the same as the configuration of the charge pump circuit 24 illustrated in FIG. 6. Note that the configurations of the charge pump circuits 24 and 25 are not limited to a configuration including the p-type transistors Tr3 and Tr4, the n-type transistors Tr5 and Tr6 and the capacitors C1 and C2 in FIG. 6, and the charge pump circuits 24 and 25 may employ other configurations.

Figure 7:
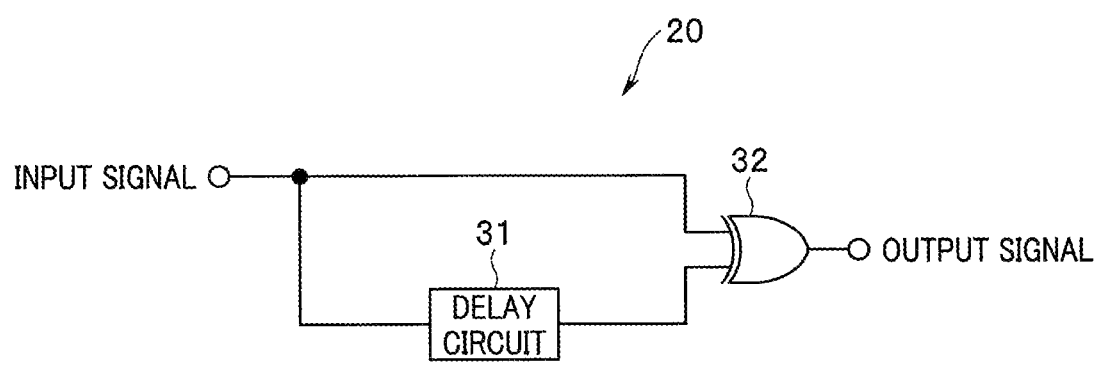
FIG. 7 is a circuit diagram illustrating an example of a circuit configuration of a boost signal generation circuit.
Figure 8:
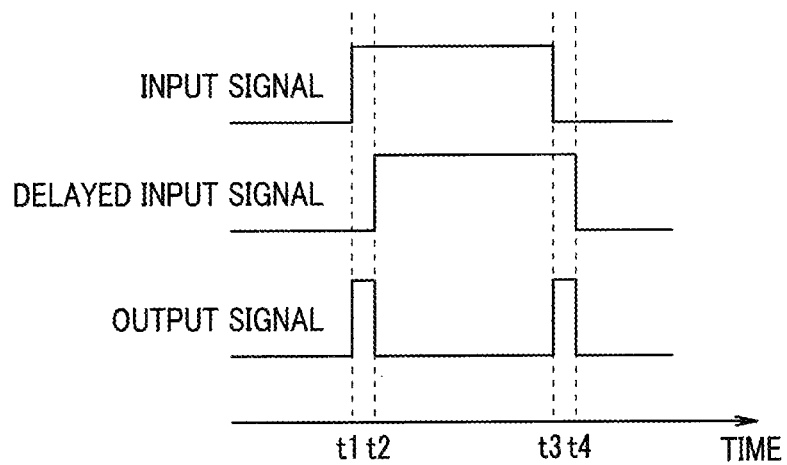
FIG. 8 is a waveform diagram illustrating an example of a waveform of an input/output signal of the boost signal generation circuit.

FIG. 7 is a circuit diagram illustrating an example of a circuit configuration of the boost signal generation circuit. FIG. 8 is a waveform diagram illustrating an example of a waveform of an input/output signal of the boost signal generation circuit.

As illustrated in FIG. 7, the boost signal generation circuit 20 is configured by including a delay circuit 31 and an XOR circuit 32.

An input signal (control signal CTRL) input to the boost signal generation circuit 20 is input to the delay circuit 31 and one terminal of the XOR circuit 32. The delay circuit 31 delays the input signal by a predetermined period and outputs the delayed input signal to the XOR circuit 32. The delayed input signal which is delayed by a predetermined period by the delay circuit 31 is input to the other terminal of the XOR circuit 32.

By this means, the input signal and the delayed input signal illustrated in FIG. 8 are input to the XOR circuit 32. A level of the input signal is switched from an L level to an H level at time t1 and switched from an H level to an L level at time t3. Further, a level of the delayed input signal which is delayed by the delay circuit 31 is switched from an L level to an H level at time t2 and switched from an H level to an L level at time t4.

The XOR circuit 32 outputs a signal of an H level in a case where levels of the input signals are different. Thus, the XOR circuit 32 outputs an output signal (boost signal) of an H level to the OR circuit 21 during a period from time t1 to time t2 and during a period from time t3 to time t4.

In this manner, the boost signal generation circuit 20 outputs an output signal (boost signal) to the OR circuit 21 immediately after a level of the control signal CTRL is switched from an L level to an H level or from an H level to an L level. In other words, the boost signal generation circuit 20 outputs an output signal (boost signal) of an H level to the OR circuit 21 immediately after the boost signal generation circuit 20 detects a rising edge or a falling edge of the control signal CTRL. A pulse width of the output signal can be arbitrarily determined in accordance with a period (delay amount) by which the delay circuit 31 delays the input signal. Note that a configuration of the boost signal generation circuit 20 is not limited to the configuration in FIG. 7, and the boost signal generation circuit 20 may employ other configurations as long as the boost signal generation circuit 20 has a configuration that can detect an edge of the control signal CTRL.

Figure 9:
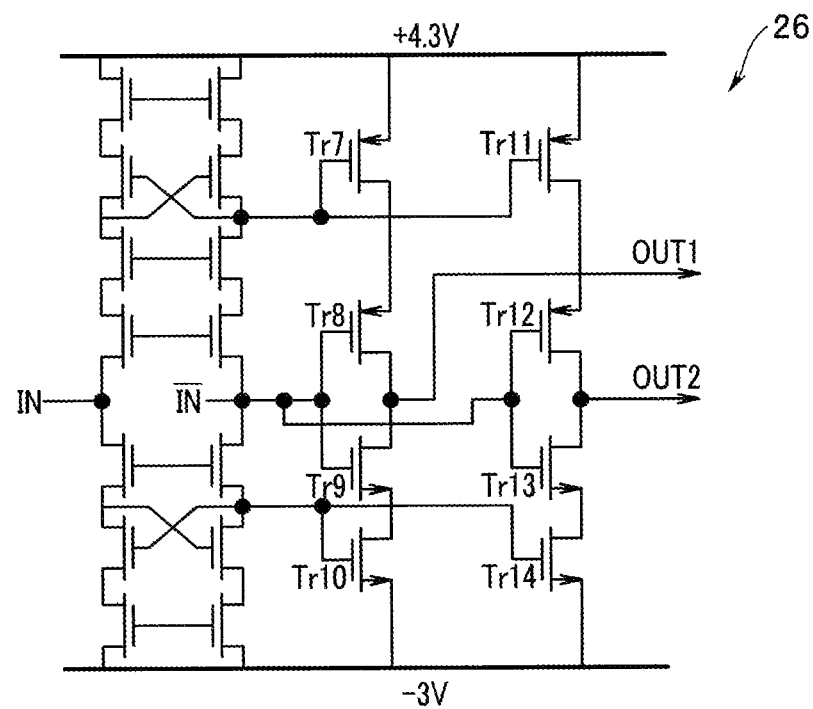
FIG. 9 is a circuit diagram illustrating an example of a circuit configuration of a level shifter circuit.

FIG. 9 is a circuit diagram illustrating an example of a circuit configuration of the level shifter circuit.

The level shifter circuit 26 is configured by including a plurality of transistors. To the level shifter circuit 26, the control signal CTRL is input as an input, and the inverted control signal CTRL is input as an inverted input.

If the control signal CTRL of an H level (1.8 V) is input, p-type transistors Tr7 and Tr8 are turned ON, and the level shifter circuit 26 outputs the signal OUT1 for which the level is shifted to +4.3 V.

In a similar manner, if the control signal CTRL of an H level (1.8 V) is input, p-type transistors Tr11 and Tr12 are turned ON, and the level shifter circuit 26 outputs the signal OUT2 for which the level is shifted to +4.3 V.

On the other hand, if the control signal CTRL of an L level (0 V) is input, n-type transistors Tr9 and Tr10 are turned ON, and the level shifter circuit 26 outputs the signal OUT1 for which the level is shifted to −3 V.

In a similar manner, if the control signal CTRL of an L level (0 V) is input, n-type transistors Tr13 and Tr14 are turned ON, and the level shifter circuit 26 outputs the signal OUT2 for which the level is shifted to −3 V.

According to such a configuration, the level shifter circuit 26 can output the signals OUT1 and OUT2 for which the levels are shifted to +4.3 V or −3 V to the transistors Tr1a and Tr1b of the RF switch 28.

Note that the configuration of the level shifter circuit 26 is not limited to the configuration in FIG. 9, and the level shifter circuit 26 may employ other configurations as long as the level shifter circuit 26 has a configuration that shifts the levels of the control signals CTRL of an H level and an L level to +4.3 V and −3 V.

Here, simulation results of a switching period of the switch in a case where the respective switches of the RF switch 28 are not divided into two groups and a switching period of the switch in a case where the respective switches of the RF switch 28 are divided into two groups will be described using FIG. 10 and FIG. 11.

Figure 10:
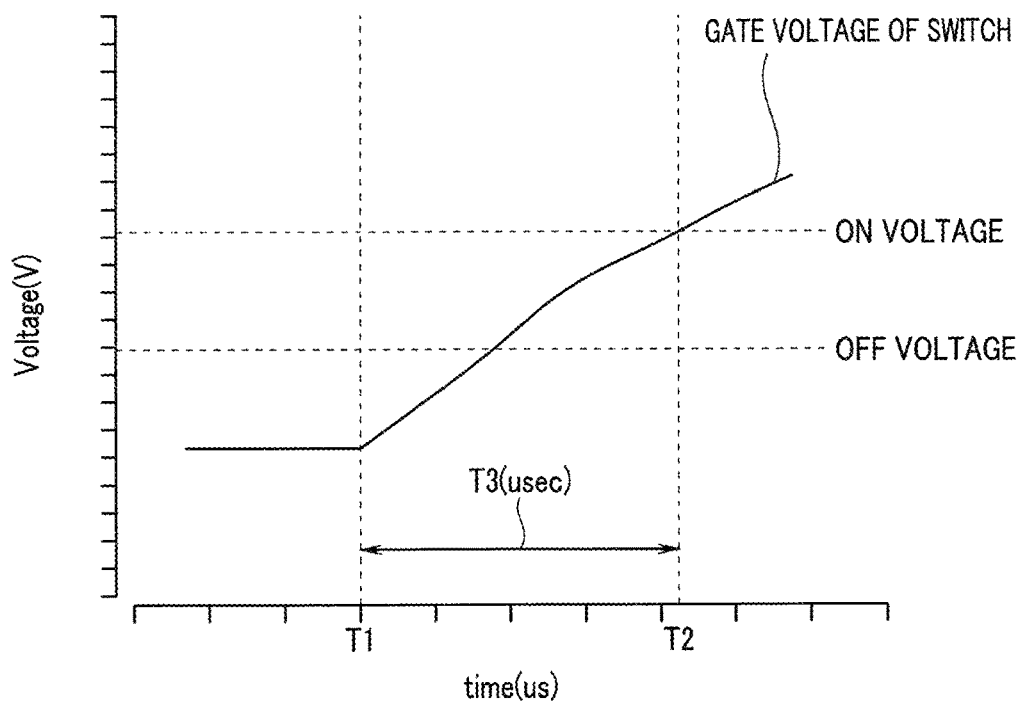
FIG. 10 is a waveform diagram illustrating a simulation result of a switching period of a switch in a case where respective switches of the RF switch are not divided into two groups.

FIG. 10 is a waveform diagram illustrating a simulation result of a switching period of the switch in a case where the respective switches of the RF switch are not divided into two groups. FIG. 11 is a waveform diagram illustrating a simulation result of a switching period of the switch in a case where the respective switches of the RF switch are divided into two groups.

As illustrated in FIG. 10, in a case where the respective switches of the RF switch 28 are not divided into two groups, a time point at which switching of the switch is started is T1, and a time point at which a gate voltage of the switch becomes an ON voltage is T2. Thus, in a case where the respective switches of the RF switch 28 are not divided into two groups, a switching period of the switch is T3 (usec).

Figure 11:
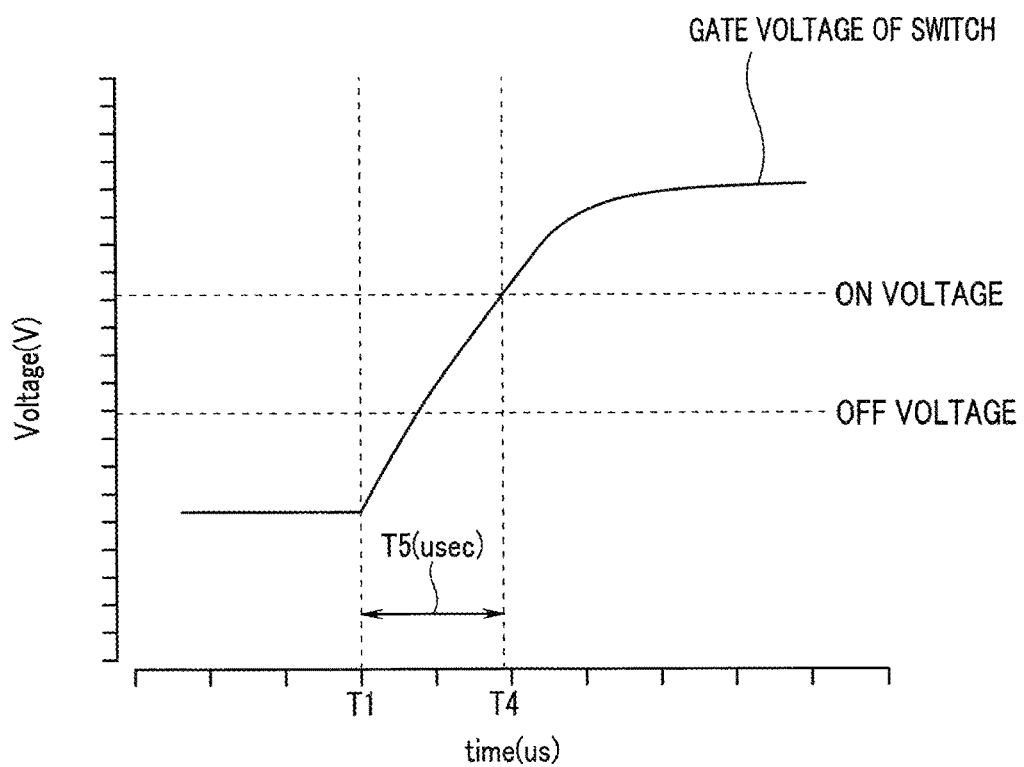
FIG. 11 is a waveform diagram illustrating a simulation result of a switching period of the switch in a case where the respective switches of the RF switch are divided into two groups.

On the other hand, as illustrated in FIG. 11, in a case where the respective switches of the RF switch 28 are divided into two groups, a time point at which switching of the switch is started is T1, and a time point at which the gate voltage of the switch becomes an ON voltage is T4. Thus, in a case where the respective switches of the RF switch 28 are divided into two groups, a switching period of the switch is T5 (usec).

From these simulation results, in a case where the respective switches of the RF switch 28 are divided into two groups, the switching period of the switch becomes approximately half of the switching period of the switch in a case where the respective switches of the RF switch 28 are not divided into two groups, so that higher-speed switching of the switch is achieved.

As described above, in the present embodiment, a higher withstand voltage is achieved by connecting the plurality of transistors Tr1a and Tr1b of the RF switch 28 in multiple stages, that is, connecting switches in multiple stages. Typically, if switches are connected in multiple stages, while a higher withstand voltage can be achieved, a switching period of the switch becomes longer.

In contrast, in the present embodiment, by dividing a plurality of switches of the RF switch 28 into two groups and switching the switches with different signals, speed-up of a switching period of the switch is achieved as described above.

Thus, according to the switch circuit 10 of the present embodiment, it is possible to achieve a higher withstand voltage of the RF switch 28 and higher-speed switching.

Note that while in the present embodiment, a plurality of transistors of the RF switch 28 are divided into two groups of a group of the transistors Tr1a and a group of the transistors Tr1b, the plurality of transistors may be divided into three or more groups.

In this case, the level shifter circuit 26 only requires to be configured to output signals for controlling ON/OFF to the groups of transistors which are divided into groups. By dividing a plurality of transistors of the RF switch 28 into three or more groups and controlling ON/OFF with different signals, further speed-up of a switching period of the RF switch 28 can be achieved.

While certain embodiments have been described, these embodiments have been presented by way of example only, and are not intended to limit the scope of the inventions. Indeed, the novel devices and systems described herein may be embodied in a variety of other forms; furthermore, various omissions, substitutions and changes in the form of the devices and systems described herein may be made without departing from the spirit of the inventions. The accompanying claims and their equivalents are intended to cover such forms or modifications as would fall within the scope and spirit of the inventions.

What is claimed is:

1. A switch circuit comprising:
   a radio-frequency switch including a first switch group and a second switch group each including a plurality of switches, and configured to switch transmission/reception of a radio-frequency signal;
   a level shifter circuit configured to output a first signal for controlling ON/OFF of each switch of the first switch group and a second signal for controlling ON/OFF of each switch of the second switch group;
   a first charge pump circuit configured to generate a positive voltage or a negative voltage that is a source of the first and second signals output by the level shifter circuit; and
   a second charge pump circuit configured to operate to temporarily increase a drive capability of the first charge pump circuit in a case where the first charge pump circuit cannot output the positive or negative voltage.

2. The switch circuit according to claim 1, wherein in the radio-frequency switch, the each switch of the first switch group and the each switch of the second switch group are connected in series.

3. The switch circuit according to claim 1, further comprising a filter circuit configured to isolate noise from the first signal and the second signal and supply the first signal and the second signal from which the noise is isolated to the radio-frequency switch.

4. The switch circuit according to claim 3, wherein the filter circuit includes a first resistor for isolating the noise from the first signal and a second resistor for isolating the noise from the second signal.

* * * * *